(12) United States Patent
Ying et al.

(10) Patent No.: US 11,605,682 B2
(45) Date of Patent: Mar. 14, 2023

(54) OLED DISPLAY PANEL AND ELECTRONIC DEVICE HAVING THE SAME

(71) Applicant: WUHAN CHINA STAR OPTOELECTRONICS SEMICONDUCTOR DISPLAY TECHNOLOGY CO., LTD., Wuhan (CN)

(72) Inventors: Jun Ying, Wuhan (CN); Guochao Wang, Wuhan (CN)

( * ) Notice: Subject to any disclaimer, the term of this patent is extended or adjusted under 35 U.S.C. 154(b) by 183 days.

(21) Appl. No.: 16/757,867

(22) PCT Filed: Dec. 11, 2019

(86) PCT No.: PCT/CN2019/124606
§ 371 (c)(1),
(2) Date: Apr. 21, 2020

(87) PCT Pub. No.: WO2021/027201
PCT Pub. Date: Feb. 18, 2021

(65) Prior Publication Data
US 2021/0408146 A1    Dec. 30, 2021

(30) Foreign Application Priority Data
Aug. 9, 2019  (CN) .......................... 201910736320.6

(51) Int. Cl.
*H01L 27/32* (2006.01)
*H01L 51/52* (2006.01)

(52) U.S. Cl.
CPC ........ *H01L 27/326* (2013.01); *H01L 27/3234* (2013.01); *H01L 27/3272* (2013.01); *H01L 27/3276* (2013.01); *H01L 51/5281* (2013.01)

(58) Field of Classification Search
CPC .................................................. H01L 51/5281
See application file for complete search history.

(56) References Cited

U.S. PATENT DOCUMENTS

2018/0299603 A1* 10/2018 Lee ..................... G02B 5/3016
2020/0394964 A1* 12/2020 Hyun .................. H01L 27/3234
2021/0126059 A1*  4/2021 Chang ..................... G09G 3/20

* cited by examiner

*Primary Examiner* — Suberr L Chi
(74) *Attorney, Agent, or Firm* — JMB Davis Ben-David

(57) ABSTRACT

An organic light emitting diode (OLED) display panel and an electronic device are provided. The OLED display includes an under-screen camera display region and a normal display region surrounding the under-screen camera display region. A pixel density of the under-screen camera display region is less than a pixel density of the normal display region. By lowering the pixel density of the under-screen camera display region, and thereby raising a light transmittance of the under-screen camera display region, an under-screen camera and a true full screen display are realized.

8 Claims, 5 Drawing Sheets

OLED DISPLAY PANEL AND ELECTRONIC DEVICE HAVING THE SAME

CROSS-REFERENCE TO RELATED APPLICATIONS

This is the U.S. National Stage of International Patent Application No. PCT/CN2019/124606 filed Dec. 11, 2019, which in turn claims the benefit of Chinese Patent Application No. 201910736320.6 filed Aug. 9, 2019.

FIELD OF INVENTION

The present disclosure relates to a technical field of displays, and particularly to an organic light emitting (OLED) display panel and an electronic device.

BACKGROUND OF DISCLOSURE

Organic light emitting diode (OLED) display devices have many advantages, such as self-illumination, low driving voltages, high luminous efficiency, fast response times, high definition and contrast, about 180° viewing angles, wide operating temperature ranges, implementation of flexible display, large-area full-color display, etc., and are recognized by the industry as the most promising display devices.

An OLED display device is a self-luminous display device, and generally includes a pixel electrode and a common electrode respectively serving as an anode and a cathode. An organic light emitting layer disposed between the pixel electrode and the common electrode, so that when an appropriate voltage is applied to the anode and the cathode, light is emitted from an organic light emitting layer. The organic light emitting layer includes a hole injection layer disposed on the anode, a hole transport layer disposed on the hole injection layer, a light emitting layer disposed on the hole transport layer, an electron transport layer disposed on the light emitting layer, and an electron injection layer disposed on the electron transport layer. The light emitting mechanism is as follows. Under the driving by a certain voltage, electrons and holes are respectively injected from the cathode and the anode to the electron injection layer and the hole injection layer. The electrons and the holes pass through the electron transport layer and the hole injection layer. The electrons and the holes migrate to the light emitting layer through the electron transport layer and the hole transport layer, meet in the light emitting layer to form excitons, and excite the light emitting molecules, which emit visible light after radiation release.

With the rapid development of mobile electronic product industry, new products are constantly released, and the market has increasingly high expectations for mobile display electronic products. For example, mobile phones and other products have evolved from regular bezels to narrow bezels and bezel-less devices. No bezel arranged on the top and bottom of the device screen directly affects the placement of a front camera, photosensitive device and product logo. To this end, many suppliers of mobile phones/display panels have narrowed the bezels and manufactured special-shaped screens, such as "water drop notch screens", "wide notch screens", "punched hole screens", and the like, to gradually increase the screen-body ratio while completing the front camera and the photosensitive device, and achieving the improvements of both functions and aesthetics of the mobile phones. However, the camera region of the "water drop notch" and "wide notch" is separate from the display region, and the region inside the hole of the "punched hole screen" cannot display images.

Therefore, no matter "water drop notch screens", "wide notch screens", "punched hole screens", etc. cannot achieve a true full screen.

SUMMARY OF INVENTION

An object of the present disclosure is to provide an OLED display panel capable of realizing both an under-screen camera and a true full-screen display.

An object of the present invention is also to provide an electronic device capable of realizing both an under-screen camera and a true full-screen display.

To achieve the above objects, the present disclosure provides an organic light emitting diode (OLED) display panel including an under-screen camera display region and a normal display region surrounding the under-screen camera display region, wherein a pixel density of the under-screen camera display region is less than a pixel density of the normal display region.

The OLED display panel includes a plurality of crisscrossed signal lines, wherein an interval between adjacent two of the signal lines in the under-screen camera display region is smaller than an interval between adjacent two of the signal lines in the normal display region.

The OLED display panel further includes a plurality of auxiliary metal lines and a black light-shielding layer covering each of the auxiliary metal lines, wherein the plurality of auxiliary metal lines are located in the under-screen camera display region, and each of the auxiliary metal lines correspondingly covers at least adjacent two of the signal lines.

A planarization layer is disposed below the auxiliary metal lines, the planarization layer forms grooves having one-to-one correspondence to the auxiliary metal lines, and each of the auxiliary metal lines and the black light-shielding layer covering each of the auxiliary metal lines are all located in a corresponding one of the grooves.

An upper surface of the black light shielding layer is flush with an upper surface of the planarization layer.

To achieve the above objects, the present disclosure provides an electronic device, including an OLED display panel and a camera, wherein the OLED display panel includes an under-screen camera display region and a normal display region surrounding the under-screen camera display region, a pixel density of the under-screen camera display region is less than a pixel density of the normal display region, and the camera is disposed under the under-screen camera display region.

The electronic device further includes a polarizer disposed on the OLED display panel, wherein the polarizer is provided with an opening in a region corresponding to the under-screen camera display region.

The OLED display panel includes a plurality of crisscrossed signal lines, wherein an interval between adjacent two of the signal lines in the under-screen camera display region is smaller than an interval between adjacent two of the signal lines in the normal display region.

The OLED display panel further includes a plurality of auxiliary metal lines and a black light-shielding layer covering each of the auxiliary metal lines, wherein the plurality of auxiliary metal lines are located in the under-screen camera display region, and each of the auxiliary metal lines correspondingly covers at least adjacent two of the signal lines.

A planarization layer is disposed below the auxiliary metal lines, the planarization layer forms grooves having one-to-one correspondence to the auxiliary metal lines, each of the auxiliary metal lines and the black light-shielding layer covering each of the auxiliary metal lines are all located in a corresponding one of the grooves, and an upper surface of the black light shielding layer is flush with an upper surface of the planarization layer.

Beneficial effect of the present disclosure: The present disclosure provides an organic light emitting diode (OLED) display panel, including an under-screen camera display region and a normal display region surrounding the under-screen camera display region. A pixel density of the under-screen camera display region is less than a pixel density of the normal display region. By lowering the pixel density of the under-screen camera display region, and thereby raising a light transmittance of the under-screen camera display region, an under-screen camera and a true full screen display are realized. The present disclosure further provides an electronic device capable of realizing both an under-screen camera and a true full screen display.

BRIEF DESCRIPTION OF DRAWINGS

In order to further understand the features and technical contents of the present disclosure, refer to the following detailed description of the present disclosure and the accompanying drawings, but the drawings are provided for reference and explanation only, and are not intended to limit the present disclosure.

In the drawing.

DETAILED DESCRIPTION OF PREFERRED EMBODIMENTS

In order to further explain the technical means employed by the present disclosure and its effects, the details are described as follows with reference to the preferred embodiments of the present disclosure and the accompanying drawings.

Figure 1:
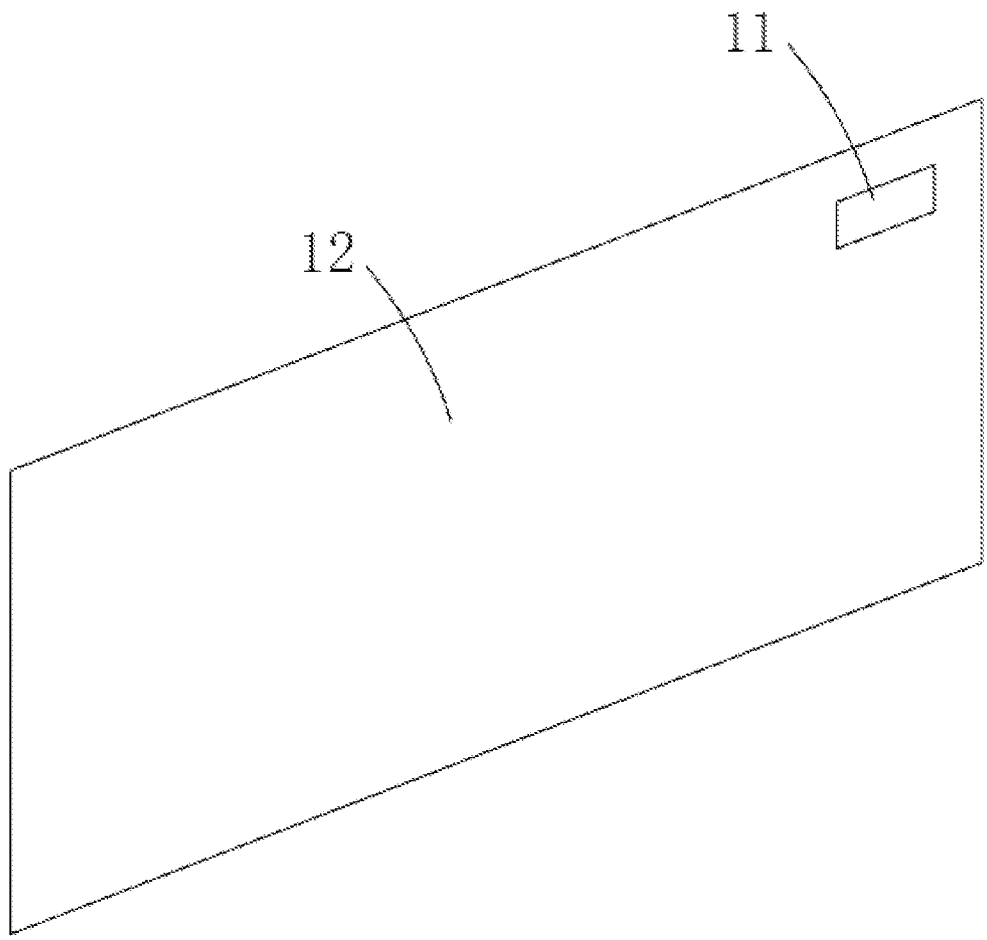
FIG. 1 is a schematic diagram of an organic light emitting diode (OLED) display panel as claimed in the present disclosure.
Figure 2:
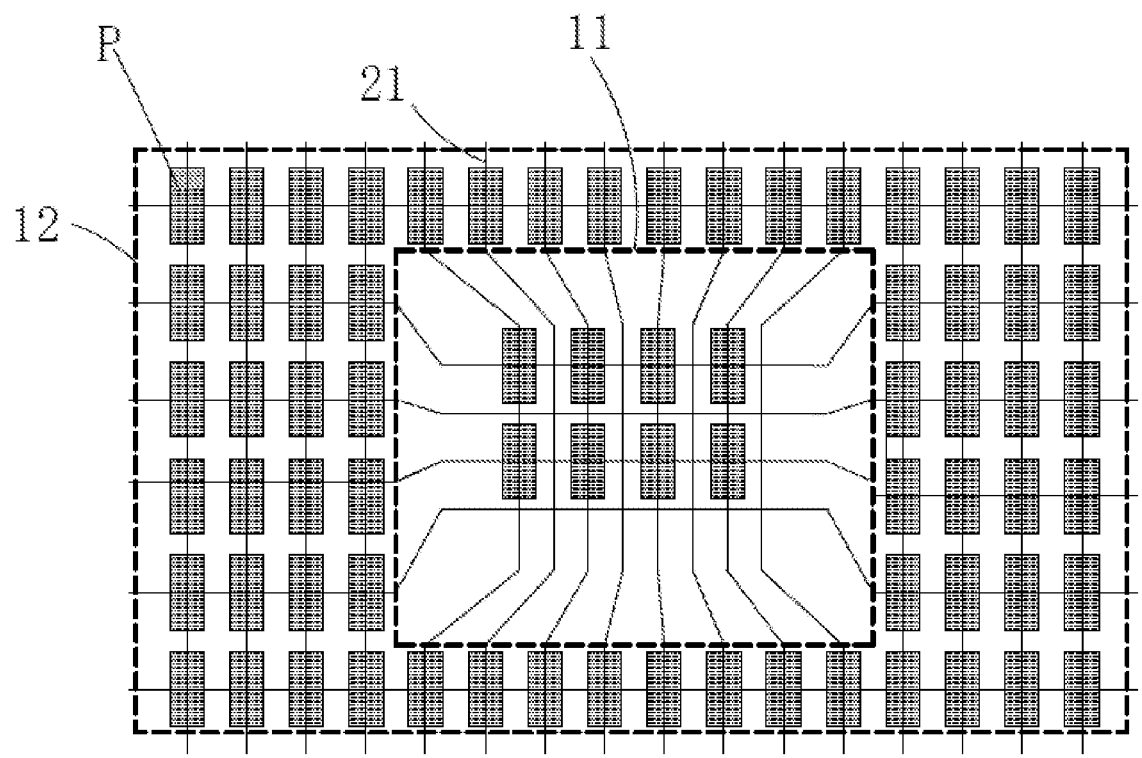
FIG. 2 is a pixel distribution diagram of an under-screen camera display region and a normal display region of an OLED display panel in accordance with the present disclosure.

Refer to FIG. 1 and FIG. 2. The present disclosure provides an organic light emitting diode (OLED) display panel. The OLED display panel has an under-screen camera display region 11 and a normal display region 12 surrounding the under-screen camera display region 11. A pixel density of the under-screen camera display region 11 is smaller than a pixel density of the normal display region 12.

As shown in FIG. 2, because the pixel density of the under-screen camera display region 11 is reduced, in case that a size of the under-screen camera display region 11 itself is unchanged, a number of opaque sub-pixels P in the under-screen camera display region 11 is reduced, and a light transmissive region increases as the pixel density decreases, so that the under-screen camera display region 11 has a sufficient light transmittance to realize an under-screen camera, and moreover, the under-camera display region 11 can still display images. That is, a full-screen display is realized while an under-screen camera is realized.

Refer to FIG. 2. The OLED display panel 1 includes a plurality of crisscrossed signal lines 21, wherein an interval between adjacent two of the signal lines 21 in the under-screen camera display region 11 is smaller than an interval between adjacent two of the signal lines in the normal display region 12. As shown in FIG. 2, in some embodiments of the present disclosure, the vertical signal line 21 is a data line, and the horizontal signal line 21 is a scanning line. Each vertical signal line 21 is connected to a column of sub-pixels P, and each horizontal signal line 21 is connected to a row of sub-pixels P. When passing through the under-screen camera display region 11, the signal lines 21 move closer to a center of the under-screen camera display region 11, so that the signal lines 21 are densely arranged in the under-screen camera display region 11, to realize the interval between adjacent two of the signal lines 21 in the under-screen camera display region 11 being smaller than the interval between adjacent two of the signal lines in the normal display region 12.

Furthermore, in the embodiment shown in FIG. 2, in the under-screen camera display region 11, only the signal lines 21 of the odd rows and the odd columns are electrically connected to the sub-pixels P, and the signal lines 21 of the even rows and the even columns pass directly through the under-screen camera display region 11 without connecting any sub-pixels P, so as to reduce the pixel density in the under-screen camera display region 11, so that the pixel density of the under-camera display region 11 is smaller than the pixel density of the normal display region 12.

Figure 3:
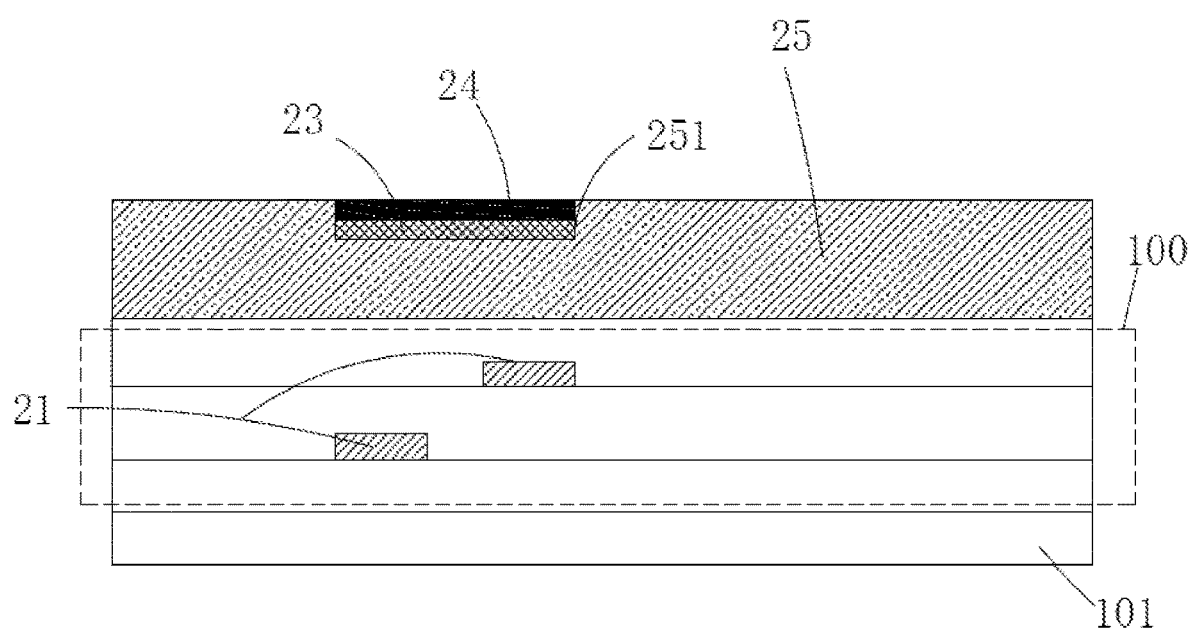
FIG. 3 is a cross-sectional view showing a position of an auxiliary metal line in an under-screen camera display region of an OLED display panel in accordance with the present invention.

Specifically, as shown in FIG. 3, in order to avoid undesirable optical effects, such as diffractions, caused by the signal lines 21 being densely arranged in the under-screen camera display region 11, the OLED display panel of the present disclosure further includes a plurality of auxiliary metal lines 23. The plurality of auxiliary metal wires 23 are located in the under-screen camera display region 11, and each of the auxiliary metal lines 23 correspondingly covers at least adjacent two of the signal lines. The shielding of the auxiliary metal wires 23 can effectively prevent the densely arranged signal wires 21 from generating undesired optical effects, and from affecting the imaging effect. Preferably, the interval between adjacent auxiliary metal lines 23 ranges from 50 to 500 um to ensure that sufficient spacing is provided to avoid the undesired optical effects, such as light diffractions and interferences.

In detail, as shown in FIG. 3, in order to prevent metal reflection from affecting the contrast and the light emission characteristics of the screen, each of the auxiliary metal wires 23 of the present disclosure is covered by a black light-shielding layer 24. The black light-shielding layer 24 absorbing light reduces metal reflection, so that the display panel can remain black without a polarizer.

As shown in FIG. 3, a planarization layer 25 is disposed below the auxiliary metal lines 23. In order to prevent the height difference caused by addition of the black light-shielding layer 24 from affecting quality of formed films in subsequent processes, the planarization layer 25 forms grooves 251 having one-to-one correspondence to the auxiliary metal lines 23. Each of the auxiliary metal lines 23 and the black light-shielding layer 24 covering each of the auxiliary metal lines 23 are all located in a corresponding one of the grooves 251. Preferably, an upper surface of the black light shielding layer 24 is flush with an upper surface of the planarization layer 25, so that topography of the entire films is still flat after the black light-shielding layer 24 is formed, thereby preventing the problems, such as poor elevation due to the height difference in the subsequent processes, and ensuring the quality of the formed films in the subsequent processes.

Figure 4:
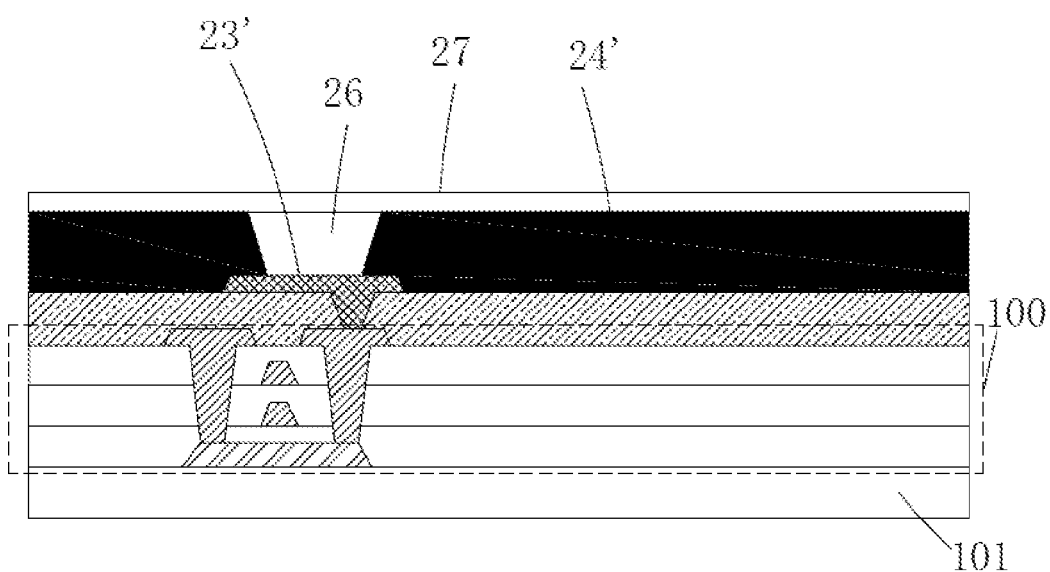
FIG. 4 is a cross-sectional view showing a pixel region of an under-screen camera display region of an OLED display panel in accordance with the present disclosure.

It should be noted that, as shown in FIG. 4, specific structures of a pixel region of the OLED display panel of the present disclosure is as follows: a substrate 101, a driving layer 100 disposed on the substrate 101, a planarization layer 25 disposed on the driving layer 100, an anode 23' disposed on the planarization layer 25, a pixel defining layer 24' disposed on the anode 23' and the planarization layer 25, a pixel defining groove 251 formed in the pixel defining layer 24' and exposing a part of the anode 23', a light emitting layer 26 disposed in the pixel defining groove 251, and a cathode 27 disposed on the light emitting layer 26 and the pixel defining layer 24'. A plurality of thin film transistors (TFTs) and a plurality of signal lines 21 connected to the plurality of TFTs are formed in the driving layer 100. According to a driving requirement, the plurality of signal lines 21 may be located in a same metal layer or in different metal layers.

In combination with FIG. 2 and FIG. 3, the auxiliary metal line 23 and the anode 23' are disposed in a same layer and formed simultaneously through a patterning process. The pixel defining layer 24' and the black light shielding layer 24 are disposed in a same layer and formed simultaneously through a patterning process. Materials of the pixel defining layer 24' and the black light shielding layer 24 are also black light shielding materials.

Furthermore, the anode 23' is electrically connected to the driving layer 100 through a via hole 252 passing through the planarization layer 25. The process of forming the via hole 252 and the groove 251 on the planarization layer 25 can be simultaneously completed by a halftone mask.

Figure 5:
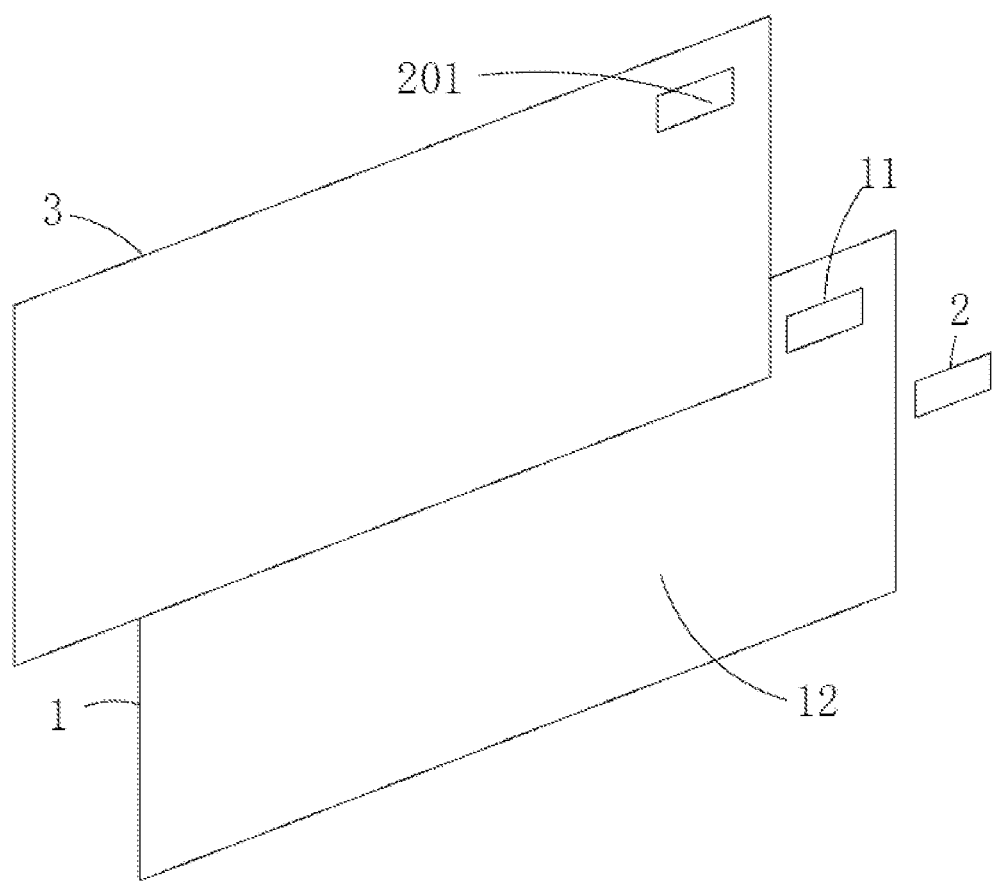
FIG. 5 is a schematic diagram of an electronic device in accordance with the present invention.

As shown in FIG. 5, the present disclosure further provides an electronic device including an OLED display panel 1 and a camera 2. The OLED display panel 1 has an under-screen camera display region 11 and a normal display surrounding the under-screen camera display region 11. In the region 12, the pixel density of the under-screen camera display region 11 is smaller than the pixel density of the normal display region 12, and the camera 2 is disposed below the under-screen camera display region 11.

As shown in FIG. 2, because the pixel density of the under-screen camera display region 11 is reduced, in case that a size of the under-screen camera display region 11 itself is unchanged, a number of opaque sub-pixels P in the under-screen camera display region 11 is reduced, and a light transmissive region increases as the pixel density decreases, so that the under-screen camera display region 11 has a sufficient light transmittance to realize an under-screen camera, and moreover, the under-camera display region 11 can still display images. That is, a full-screen display is realized while an under-screen camera is realized.

Refer to FIG. 2. The OLED display panel 1 includes a plurality of crisscrossed signal lines 21, wherein an interval between adjacent two of the signal lines 21 in the under-screen camera display region 11 is smaller than an interval between adjacent two of the signal lines in the normal display region 12. As shown in FIG. 2, in some embodiments of the present disclosure, the vertical signal line 21 is a data line, and the horizontal signal line 21 is a scanning line. Each vertical signal line 21 is connected to a column of sub-pixels P, and each horizontal signal line 21 is connected to a row of sub-pixels P. When passing through the under-screen camera display region 11, the signal lines 21 move close to a center of the under-screen camera display region 11, so that the signal lines 21 are densely arranged in the under-screen camera display region 11, so as to realize the interval between adjacent two of the signal lines 21 in the under-screen camera display region 11 being smaller than the interval between adjacent two of the signal lines in the normal display region 12.

Furthermore, in the embodiment shown in FIG. 2, in the under-screen camera display region 11, only the signal lines 21 of the odd rows and the odd columns are electrically connected to the sub-pixels P, and the signal lines 21 of the even rows and the even columns pass directly through the under-screen camera display region 11 without connecting any sub-pixels P, so as to reduce the pixel density in the under-screen camera display region 11, so that the pixel density of the under-camera display region 11 is smaller than the pixel density of the normal display region 12.

Specifically, as shown in FIG. 3, in order to avoid undesirable optical effects, such as diffractions, caused by the signal lines 21 being densely arranged in the under-screen camera display region 11, the OLED display panel of the present disclosure further includes a plurality of auxiliary metal lines 23. The plurality of auxiliary metal wires 23 are located in the under-screen camera display region 11, and each of the auxiliary metal lines 23 correspondingly covers at least adjacent two of the signal lines. The shielding of the auxiliary metal wires 23 can effectively prevent the densely arranged signal wires 21 from generating undesired optical effects, and from affecting the imaging effect. Preferably, the interval between adjacent auxiliary metal lines 23 ranges from 50 to 500 um to ensure that sufficient spacing is provided to avoid the undesired optical effects, such as light diffractions and interferences.

In detail, as shown in FIG. 3, in order to prevent metal reflection from affecting the contrast and the light emission characteristics of the screen, each of the auxiliary metal wires 23 of the present disclosure is covered by a black light-shielding layer 24. The black light-shielding layer 24 absorbing light reduces metal reflection, so that the display panel can remain black without a polarizer.

Furthermore, the electronic device further includes a polarizer 3 disposed on the OLED display panel 1, and the polarizer 3 is provided with an opening 201 in a region corresponding to the under-screen camera display region 11. By the opening 201 defined in the region corresponding to the under-screen camera display region 11, the light transmittance of the under-screen imaging display area 11 and the imaging effect can be further improved.

As shown in FIG. 3, a planarization layer 25 is disposed below the auxiliary metal lines 23. In order to prevent the height difference caused by addition of the black light-shielding layer 24 from affecting quality of formed films in subsequent processes, the planarization layer 25 forms grooves 251 having one-to-one correspondence to the auxiliary metal lines 23. Each of the auxiliary metal lines 23 and the black light-shielding layer 24 covering each of the auxiliary metal lines 23 are all located in a corresponding one of the grooves 251. Preferably, an upper surface of the black light shielding layer 24 is flush with an upper surface of the planarization layer 25, so that topography of the entire films is still flat after the black light-shielding layer 24 is formed, thereby preventing the problems, such as poor elevation due to the height difference in the subsequent processes, and ensuring the quality of the formed films in the subsequent processes.

It should be noted that, as shown in FIG. 4, specific structures of a pixel region of the OLED display panel of the present disclosure is as follows: a substrate 101, a driving layer 100 disposed on the substrate 101, a planarization layer 25 disposed on the driving layer 100, an anode 23' disposed on the planarization layer 25, a pixel defining layer 24' disposed on the anode 23' and the planarization layer 25, a pixel defining groove 251 formed in the pixel defining layer 24' and exposing a part of the anode 23', a light emitting layer 26 disposed in the pixel defining groove 251, and a cathode 27 disposed on the light emitting layer 26 and the pixel defining layer 24'. A plurality of thin film transistors (TFTs) and a plurality of signal lines 21 connected to the plurality of TFTs are formed in the driving layer 100. According to a driving requirement, the plurality of signal lines 21 may be located in a same metal layer or in different metal layers.

In combination with FIG. 2 and FIG. 3, the auxiliary metal line 23 and the anode 23' are disposed in a same layer and formed simultaneously through a patterning process. The pixel defining layer 24' and the black light shielding layer 24 are disposed in a same layer and formed simultaneously through a patterning process. Materials of the pixel defining layer 24' and the black light shielding layer 24 are also black light shielding materials.

Furthermore, the anode 23' is electrically connected to the driving layer 100 through a via hole 252 passing through the planarization layer 25. The process of forming the via holes 252 and the grooves 251 on the planarization layer 25 can be simultaneously completed by a halftone mask.

In summary, the present disclosure provides an organic light emitting diode (OLED) display panel, including an under-screen camera display region and a normal display region surrounding the under-screen camera display region. A pixel density of the under-screen camera display region is less than a pixel density of the normal display region. By lowering the pixel density of the under-screen camera display region, and thereby raising a light transmittance of the under-screen camera display region, an under-screen camera and a true full screen display are realized. The present disclosure further provides an electronic device capable of realizing both an under-screen camera and a true full screen display.

As described above, for a person of ordinary skill in the art, various other corresponding changes and modifications can be made according to the technical solutions and technical concepts of the present disclosure, and all these changes and alterations should fall within the claimed scope of the claims of the present disclosure.

What is claimed is:

1. An organic light emitting diode (OLED) display panel comprising:
    an under-screen camera display region and a normal display region surrounding the under-screen camera display region, wherein a pixel density of the under-screen camera display region is less than a pixel density of the normal display region; and
    a plurality of crisscrossed signal lines, wherein an interval between an adjacent two of the plurality of crisscrossed signal lines in the under-screen camera display region is smaller than an interval between the adjacent two of the plurality of crisscrossed signal lines in the normal display region.

2. The OLED display panel as claimed in claim 1, further comprising:
    a plurality of auxiliary metal lines and a black light-shielding layer covering each of the plurality of auxiliary metal lines, wherein the plurality of auxiliary metal lines are located in the under-screen camera display region, and each of the plurality of auxiliary metal lines correspondingly covers at least the adjacent two of the plurality of crisscrossed signal lines.

3. The OLED display panel as claimed in claim 2, wherein a planarization layer is disposed below the plurality of auxiliary metal lines, the planarization layer forms grooves having a one-to-one correspondence to the plurality of auxiliary metal lines, and each of the plurality of auxiliary metal lines and the black light-shielding layer covering each of the plurality of auxiliary metal lines are all located in a corresponding one of the grooves.

4. The OLED display panel as claimed in claim 3, wherein an upper surface of the black light shielding layer is flush with an upper surface of the planarization layer.

5. An electronic device, comprising:
    an OLED display panel and a camera, wherein the OLED display panel includes an under-screen camera display region and a normal display region surrounding the under-screen camera display region, a pixel density of the under-screen camera display region is less than a pixel density of the normal display region, and the camera is disposed under the under-screen camera display region; and
    a plurality of crisscrossed signal lines, wherein an interval between an adjacent two of the plurality of crisscrossed signal lines in the under-screen camera display region is smaller than an interval between the adjacent two of the plurality of crisscrossed signal lines in the normal display region.

6. The electronic device as claimed in claim 5, further comprising a polarizer disposed on the OLED display panel, wherein the polarizer is provided with an opening in a region corresponding to the under-screen camera display region.

7. The electronic device as claimed in claim 5, wherein the OLED display panel further includes a plurality of auxiliary metal lines and a black light-shielding layer covering each of the plurality of auxiliary metal lines, wherein the plurality of auxiliary metal lines are located in the under-screen camera display region, and each of the plurality of auxiliary metal lines correspondingly covers at least the adjacent two of the plurality of crisscrossed signal lines.

8. The electronic device as claimed in claim 7, wherein a planarization layer is disposed below the plurality of auxiliary metal lines, the planarization layer forms grooves having a one-to-one correspondence to the plurality of auxiliary metal lines, each of the plurality of auxiliary metal lines and the black light-shielding layer covering each of the plurality of auxiliary metal lines are all located in a corresponding one of the grooves, and an upper surface of the black light shielding layer is flush with an upper surface of the planarization layer.

* * * * *